United States Patent [19]

Klein et al.

[11] Patent Number: 4,792,517

[45] Date of Patent: Dec. 20, 1988

[54] LUMINATE FOR THE FORMATION OF BEAM LEADS FOR IC CHIP BONDING

[75] Inventors: Gerald W. Klein, Pittsford; Robert C. McConkey, Rochester; Michel F. Molaire, Rochester; John M. Noonan, Rochester, all of N.Y.

[73] Assignee: Eastman Kodak Company, Rochester, N.Y.

[21] Appl. No.: 77,714

[22] Filed: Jul. 24, 1987

[51] Int. Cl.$^4$ .......................... G03C 1/94; G03C 1/68
[52] U.S. Cl. ..................................... 430/275; 430/288; 430/281; 430/285; 430/277; 430/278; 430/276; 522/142
[58] Field of Search ............... 430/288, 281, 285, 275, 430/277, 278, 276; 522/142

[56] References Cited

U.S. PATENT DOCUMENTS

| | | | |
|---|---|---|---|
| 4,247,623 | 1/1981 | Guild | 430/275 |
| 4,322,490 | 3/1982 | Molaire | 430/281 |
| 4,533,445 | 8/1985 | Orio | 430/285 X |
| 4,619,890 | 10/1986 | Molaire et al. | 430/495 |

Primary Examiner—Paul R. Michl
Assistant Examiner—Cynthia Hamilton
Attorney, Agent, or Firm—William J. Davis

[57] ABSTRACT

A laminate, adapted for manufacturing frames of metal beam leads that are bonded to integrated circuit chips, comprises
(a) a flexible metal strip,
(b) a layer of a first resist adhered to one surface of the metal strip, and
(c) a layer of a second resist adhered to the opposite surface of the metal strip,
the second resist being a negative-working resist comprising
(1) a polymeric binder,
(2) a photopolymerizable monomer mixture, and
(3) a photoinitiator composition. The negative-working resist exhibits excellent flexibility and adhesion to the metal and superior performance during high temperature processing, whereby it serves effectively as a support for the beam leads.

5 Claims, No Drawings

LUMINATE FOR THE FORMATION OF BEAM LEADS FOR IC CHIP BONDING

CROSS REFERENCE TO RELATED APPLICATIONS

Reference is hereby made to commonly-assigned U.S. patent applications

Ser. No. 077,712 entitled POLYMERIZABLE CYCLOHEXYLENEOXYALKYL ACRYLATES filed in the name of M. F. Molaire concurrently herewith, and Ser. No. 077,715 entitled PHOTORESIST COMPOSITION COMPRISING CYCLOHEXYLENEOXYALKYL ACRYLATES filed in the names of G. W. Klein, R. C. McConkey, M. F. Molaire and J. M. Noonan concurrently herewith.

FIELD OF THE INVENTION

This invention relates to a laminate adapted for manufacturing frames of metal beam leads that are bonded to integrated circuit (IC) chips, preferably by automated equipment.

BACKGROUND OF THE INVENTION

One of the most costly aspects of IC technology is bonding the IC chip to the rest of the circuit package. A proposed solution to this problem comprises automated bonding of metal beam leads to the IC chip, thus avoiding manual wire bonding. Such a technique uses a roll of a laminate that carries to a bonding station a plurality of frames each of which has many generally planar microscopic, spider-shaped metal fingers known as beam leads. At the bonding station the inner portions of the beam leads are aligned and then simultaneously connected to the bonding sites on the IC chip. The outer portion of the beam leads is then available for bonding to remaining portions of the circuit package.

Such beam leads can be manufactured by a photoresist process. U.S. Pat. No. 4,247,623 discloses such a process and a blank or laminate for use therein having a structure comprising a flexible strip of electrically conductive metal, a layer of positive-working resist adhered to one surface of the metal strip, and a layer of negative-working resist adhered to the opposite surface of the metal strip. The process includes the steps of imagewise exposing and developing the positive-working resist and the negative-working resist. The developed positive resist forms a protective coating on the beam lead portions of the metallic layer. The exposed metallic layer is subsequently etched to form the beam leads. The developed negative resist forms a window-bearing support spacer holding the beam leads in the desired orientation. The beam leads are maintained in their proper orientation prior to and during bonding by the spacer formed from the negative-working resist.

It is desirable from the standpoint of electronic reliability that the negative-working resist and support spacer formed therefrom exhibit good dimensional integrity and hardness at temperatures of 200° C. and higher. The reason for this is that the function of the negative-working resist of supporting the leads prior to, during, and after bonding of the IC chip can be negated by poor dimensional integrity and/or softness. Processing at temperatures of at least 200° C. frequently takes place, for example, during the steps of curing the second resist to effect complete polymerization thereof and bonding the inner and outer lead portions.

While the laminate described in U.S. Pat. No. 4,247,623 provides, under most conditions, superior beam leads, its performance at processing temperatures of 200° C. and higher has not been entirely satisfactory. Thus, what has been needed is a laminate, having the advantages, i.e. good adhesion and flexibility, of the laminate described in U.S. Pat. No. 4,247,623, and which exhibits improved dimensional integrity and hardness at processing temperatures of 200° C. and higher.

SUMMARY OF THE INVENTION

We have discovered an improved negative-working resist formulation featuring excellent adhesion and flexibility and which exhibits superior dimensional integrity and hardness at processing temperatures of 200° C. and higher.

More particularly, in accordance with the present invention, there is provided a laminate comprising a flexible metal strip, a layer of a first resist adhered to one surface of the metal strip, and a layer of a second resist adhered to the opposite surface of the metal strip. The laminate is capable of providing superior metal beam leads that can be automatically bonded to integrated circuit chips.

It is a particularly advantageous feature of the invention that the second resist can be processed at temperatures of 200° C. and that the spacer formed therefrom exhibits superior dimensional integrity and hardness at such processing temperatures and during the harsh conditions required for bonding the inner and outer portions of the leads.

It is another advantageous feature of the invention that the laminate has sufficient flexibility to withstand multiple bending and flexing as is characteristic of the processing of such laminates.

The aforedescribed advantageous features of this invention are achieved by use of a second resist which is a negative-working resist comprising a polymeric binder having a glass transition temperature of at least 150° C., a photopolymerizable monomer mixture comprising a monomer having the structural formula

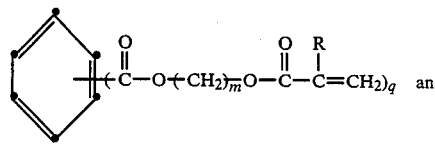 (i)

and a monomer having the structural formula

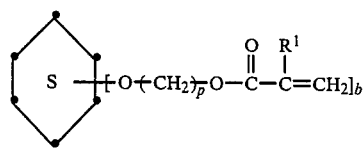 (ii)

wherein q is 1, 2, 3 or 4, b is 1 or 2, m and p are integers of from 1 to 10, and R and $R^1$ are individually H or $CH_3$, and a photoinitiator composition.

Other advantageous features of the invention will become apparent upon reference to the following Description of the Preferred Embodiments.

DESCRIPTION OF THE PREFERRED EMBODIMENTS

This invention is based partly on the discovery that certain photopolymerizable monomers when admixed with a polymeric binder having a glass transition temperature of at least 150° C. and a photoinitiator yield negative-working photoresist compositions featuring excellent adhesion and flexibility and superior dimensional integrity and hardness at processing temperatures of 200° C. and higher.

The laminate of this invention is described primarily in connection with a process for manufacturing frames of metal beam leads that are bonded to IC chips. In addition, the invention is useful in other photofabrication systems using developed resists on opposite sides of a workpiece.

As stated, the laminate of this invention comprises a flexible metal strip. An electrically conductive metallic layer can be used in the invention. Preferred are copper, aluminum and other similar metals favored for use as beam leads in bonding IC chips.

With respect to the first resist composition, any negative- or positive-working resist capable of adhering to the selected metallic layer can be used. The choice is not critical and conventional formulations are acceptable. Suitable positive-working resists comprise, in general, any insoluble, light-sensitive material that becomes removable in a developer of choice when exposed, and an optional filler or binder such as a poly(acrylic acid) or a copolymer of ethyl acrylate and methacrylic acid. Particularly useful positive-working light-sensitive materials are cresol-formaldehyde resins condensed with quinone diazides. U.S. Pat. No. 4,141,733, issued Feb. 27, 1979, provides additional examples, as does commonly owned U.S. application Ser. No. 791,271, filed Oct. 25, 1985, in the name of Barbara B. Lussier, now U.S. Pat. No. 4,684,597. Suitable negative-working compositions include conventional negative-working photoresists such as bisazide/cyclized polyisoprenes and phenolic resins.

The second resist useful in the practice of this invention is a negative-working resist which comprises a polymeric binder having a glass transition temperature of at least 150° C., a photopolymerizable monomer mixture, and a photoinitiator composition.

The photopolymerizable monomer mixture useful in the practice of this invention comprises at least one monomer having the structure (i) set forth above and at least one monomer having the structure (ii) set forth above.

Monomers having structural formula (i) above can be prepared by reacting acrylic or methacrylic acid, a polybasic aromatic acid and a polyhydric alcohol, by methods known in the art. For example component (c) of Example 1 is the product prepared by the reaction of acrylic acid, trimellitic acid and ethylene glycol. Further details are set forth in U.S. Pat. No. 4,157,261. Preferred examples of monomers having formula (i) include benzoyloxyethylacrylate, benzoyloxypropylacrylate, benzoyloxyhexylacrylate, tris(acryloyloxyethyl)-1,3,5-benzenetricarboxylate, tris(acryloyloxypropyl)-1,3,5-benzenetricarboxylate, tris(acryloyloxyhexyl)-1,3,5-benzenetricarboxylate, tris(acryloyloxyethyl)-1,2,4-benzenetricarboxylate, tris(acryloyloxypropyl)-1,2,4-benzenetricarboxylate, and tris(acryloyloxyhexyl)-1,2,4-benzenetricarboxylate.

Monomers having structural formula (ii) above are described in copending U.S. patent application Ser. No. 077,712 entitled POLYMERIZABLE CYCLOHEXYLENEOXYALKYL ACRYLATES noted above. Preferred examples of such monomers include 1,4-cyclohexylenebis(oxyethyl)diacrylate, 1,4-cyclohexylenebis(oxyethyl)dimethacrylate, 1,4-cyclohexylenebis(oxypropyl)diacrylate, 1,4-cyclohexylenebis(oxypropyl)dimethacrylate, cyclohexyleneoxyethyl acrylate, and cyclohexyleneoxyethyl methacrylate. Such monomers can be prepared by reacting acryloyl chloride or methacryloyl chloride with an hydroxyalkoxycyclohexane, which itself can be prepared by hydrogenating an hydroxyalkoxy benzene. Further details of the preparation of such monomers are set forth in U.S. patent application Ser. No. 077,712 entitled POLYMERIZABLE CYCLOHEXYLENEOXYALKYL ACRYLATES.

Useful binders for the second resist include compatible polymeric binders having a glass transition temperature of at least 150° C. By compatible, it is meant that the binder provides the desired rheology or film properties for the resist composition and coating. The coated film preferably is free of phase separation. Further, the binder must have high temperature resistance and not adversely affect the desired flexibility and adhesion. Examples of useful polymeric binders known to have high temperature resistance include polyacrylates, polyamides, polycarbonates, polyesters, polyesteramides, polyimides and particularly those described in U.S. Pat. No. 4,322,490.

Particularly useful binders include polyesters prepared from a variety of diacids and diols. Preferred polyesters have the structural formula:

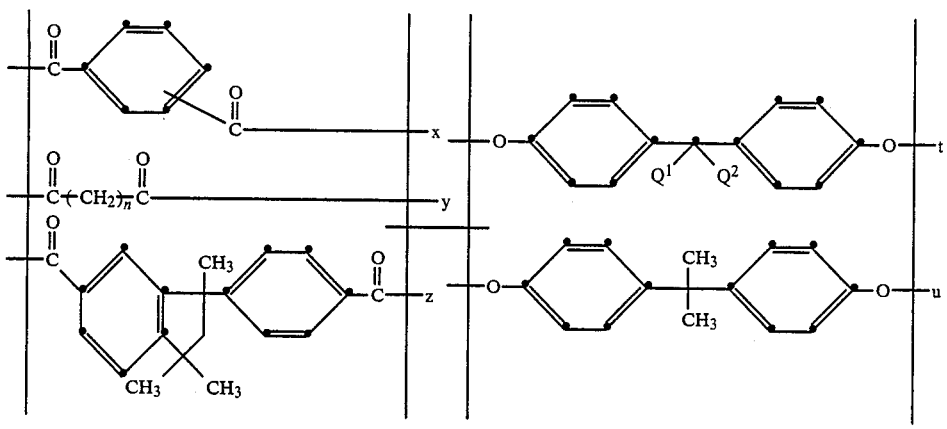

wherein
t=0–100 mole %
u=0–100
x=0–100
y=0–100
z=0–100
t+u=100
x+y+z=100
n=3–8, $Q^1$ and $Q^2$ are methyl or ethyl, or taken together $Q^1Q^2=$

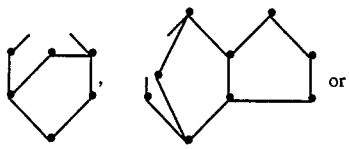 , 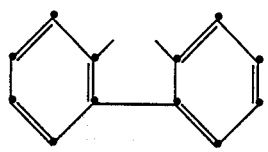

The polyesters can be substituted with lower alkyl such as methyl or halo such as chloro. Such polyesters can be prepared by methods well known in the art. For example, the binder used in Example 1 was prepared by solution condensation polymerization in a procedure similar to the preparation described in U.S. Pat. No. 4,322,490.

The photopolymerizable monomer mixture comprises monomers having the structural formulae set forth above. Preferred examples of such monomers useful in the mixture include those wherein q=3, m=2–5, p=2–5, and R and $R^1$ are H.

With respect to the photoinitiator of the second resist, any free-radical generating photoinitiator system can be used which initiates polymerization of the polymerizable monomer and does not subsequently terminate the polymerization. The free-radical generating photoinitiator system can comprise one or more compounds which directly furnish free radicals when activated by radiation. It can also comprise a plurality of compounds, one of which yields free radicals after having been caused to do so by a sensitizer which is activated by the radiation.

Representative useful examples of such photoinitiators include, for example, those described in British Pat. No. 1,507,704, including benzophenone, acetophenone, ethyl methyl ketone, cyclopentanone, benzil, caprone, benzoyl cyclobutanone, and dioctyl acetone, particularly when used in admixture with substituted benzophenones such as Michler's ketone.

Highly preferred as the photoinitiator is a mixture of a 3-ketocoumarin and an amine such as is described in the commonly owned U.S. Pat. No. 4,289,844 by Farid et al entitled "Photopolymerizable Compositions Featuring Novel Co-initiators". Representative amines include ethyl-p-dimethylaminobenzoate; other esters of p-dimethylaminobenzoic acid, e.g., n-butyl-p-dimethylaminobenzoate, phenethyl-p-dimethylaminobenzoate, 2-phthalimidoethyl-p-dimethylaminobenzoate, 2-methacryloylethyl-p-dimethylaminobenzoate, 1,5-pentyl di-(p-dimethylamino)benzoate; 4,4'-bis(dimethylamino)benzophenone; phenethyl and 1,5-pentyl esters of m-dimethylaminobenzoic acid; p-dimethylaminobenzaldehyde; 2-chloro-4-dimethylaminobenzaldehyde; p-dimethylaminoacetophenone; p-dimethylaminobenzyl alcohol; ethyl-(p-dimethylamino)-benzoyl acetate; p-N-piperidinoacetophenone; 4-dimethylamino benzoin; N,N-dimethyl-p-toluidine; N,N-diethyl-m-phenetidine; tribenzyl amine; dibenzylphenyl amine; N-methyl-N-phenylbenzylamine; p-bromo-N,N-dimethylaniline; tridodecylamine; 4,4',4"-methylidyne(N,N-dimethylaniline) (crystal violet, leuco base); 3-indoleacetic acid; and N-phenylglycine.

The coumarin associated with the amine can be one or more of, e.g., the following: 3-(2-benzofuroyl)-7-diethylaminocoumarin; 3-(2-benzofuroyl)-7-(1-pyrrolidinyl)coumarin; 7-dimethylamino-3-thenoylcoumarin; 3-benzoyl-7-diethylaminocoumarin; 3-(o-methoxybenzoyl)-diethylaminocoumarin; 3-(m-fluorosulfonyl)-benzoyl-diethylaminocoumarin; 3-(p-dimethylaminobenzoyl)-diethylaminocoumarin; 3,3'-carbonylbis(5,7-di-n-propoxy coumarin); 3,3'-carbonylbis(7-diethylamino coumarin); 3-benzoyl-7-methoxycoumarin; 3-(2-furoyl)-7-diethylaminocoumarin; 3-(p-dimethylaminobenzoyl)-7-diethylaminocoumarin; 3-(p-diethylaminostyrylcarbonyl)-diethylaminocoumarin; 3-(p-morpholinostyrylcarbonyl)-diethylaminocoumarin; 9-(7-diethylamino-3-coumarinoyl)-1,2,4,5-tetrahydro-3H, 6H,10H[1]benzopyrano[9,9a,1-gh]quinolazine-10-one which has the structure

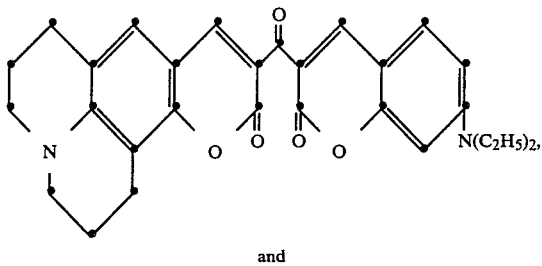

and 9-(7-n-propylamino-3-coumarinoyl)-2,4,5-tetrahydro 3H,6H,10H[1]benzopyrano[9,9a,1-gh]quinolazine-10-one.

The photoinitiator composition can be present in an amount from 0.05 to about 10 weight percent, and preferably from 0.10 to 5 weight percent.

The second resist composition of the invention can optionally include a variety of conventional addenda, examples of which are readily obtainable from the literature. For example, a filler can be selected to provide one or more of a variety of desirable properties to the second resist composition, such as lower cost, minimal shrinkage during cure, improved flatness, improved thermal conductivity, decreased tackiness, higher modulus, and/or the desired dielectric constant. Preferred fillers include silica dioxide, glass beads (solid and hollow), alumina, alumina nitride, and aluminum borosilicate. The filler must not adversely affect the coatability of the resist and accordingly, is present in particles which are less than about 100 microns, preferably less than about 10 microns, in size. The filler can be present in an amount up to 80 weight percent based on the weight of the solvent free second resist. The optimum filler loading depends of course on the particular filler selected and application and is readily determined by one skilled in the art.

The weight percents of the components of the second resist can be varied widely, based on the total weight of the solvent-free composition. The monomers noted above, can each be present in an amount from about 0.1 to about 90 weight percent, and preferably from 0.5 to 65 weight percent.

Photoinhibitors are often desirable for use with the monomers. Useful examples of photoinhibitors include hydroquinone, 3-t-butyl-4-hydroxy-5-methylphenyl sulfide, t-butylpyrocatechol and thiobis-4,4'-(2-tert-butyl-6-methylphenol).

Stabilizers, for example benzotriazole, can also be added, if desired.

The dried negative-working resist layer has a thickness sufficient to provide the desired spacer support function, preferably from 10 to about 250 microns. The dried first resist is preferably from about 1.0 to about 100 microns thick, and the metallic layer from about 5 to about 100 microns thick, although other thicknesses outside these ranges may also be useful in certain applications.

The photoresists of the invention can be applied to the metal layer by a wide variety of techniques, including coating techniques such as spray-coating, whirl-coating, curtain-coating, and the like, all of which are conventional.

Any suitable solvent can be selected for preparing a coating of either resist on the metallic layer. Typical examples include dichloromethane, acetone, benzene, acetates, alcohols, ethers, toluene, 1,1,1-trichloroethane, ethyl 3-ethoxypropionate, ethyl 3-methoxypropionate, 1-methoxy-2-propyl propionate, 1-methoxy-3-propyl acetate, 1-ethoxy-2-propyl acetate, 2-ethoxyethyl acetate, 2-methoxyethanol, 2-ethoxyethanol, propylene glycol monomethyl ether acetate, 2-methoxyethyl-acetate, and the like. The choice will depend of course upon the composition selected for the resist.

The laminate of the invention comprises the above-described metallic strip and resist layers. The second resist can optionally include a removable cover sheet. Such a sheet is particularly useful for formulations that tend to be somewhat tacky or oxygen sensitive. The cover sheet can be either preformed and then laminated to the resist layer, or it can be cast in place as a film from a water-soluble polymer. Examples of the former include cellulose esters such as cellulose triacetate, polyamides, polyolefins, vinyl polymers and polyesters. Examples of the latter include poly(vinyl alcohol) or hydroxyalkyl cellulose of from 1-2 carbon atoms in the alkyl portion.

The thickness of such cover sheets is not critical. However, an excessive thickness makes removal more difficult. For example, a thickness of 12 to about 50 microns can be used. A preferred thickness is from about 15 to about 25 microns.

A preferred method of storage of the laminate of the invention is in strip form coiled upon a suitable spool or mandrel into a roll. In such cases, the cover sheet is one which prevents transfer of monomer to the next adjacent section of the strip. Useful materials having such a property include polyester films.

As noted, the laminate of this invention is particularly adapted for manufacturing frames of metal beam leads that are bonded to IC chips. The processes of forming the frames and bonding the IC chips to such frames are adequately described in aforedescribed U.S. Pat. No. 4,247,623, the disclosure of which is hereby incorporated by reference in its entirety. Such process preferably is carried out in a continuous mode. The washers used to remove portions of the resists contain conventional resist developers, such as aqueous bases, buffered aqueous bases, 1,1,1-trichloroethane, dichloromethane, acetone, benzene, alcohols, ethers, toluene, KMPR-809 developer, available from KTI Chemicals, Inc., and the like. When the laminate is used to prepare metal beam leads, the first resist preferably is developable in a developer which does not substantially dissolve the second resist. The reason for this of course is that the second resist preferably is intact during etching of the metallic strip to form the beam leads.

The developed second resist preferably is cured to remove solvent, for example, by baking in an oven for 2-30 minutes at 200° C., to effect increased polymerization of the monomers.

EXAMPLES

The following examples further illustrate the invention.

EXAMPLES 1-3

The following negative-resist formulation of Table I was coated at 40 microns dry thickness onto a 35 micron thick copper foil coated on one side with a 5 micron thick positive-working resist having the composition set forth in Table II to form a continuous film strip.

TABLE I
Composition of (Negative-Working) Second Resist

| | Wt. % |
|---|---|
| (A) 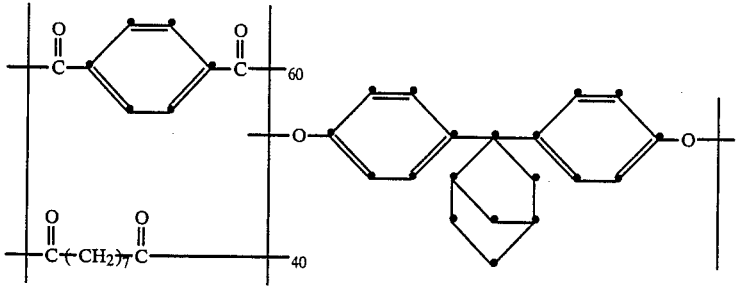 | 53 |
| (B) 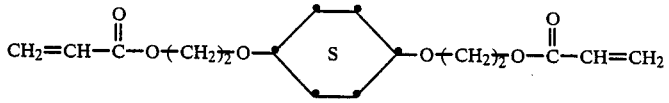 | 22.5 |
| (C) 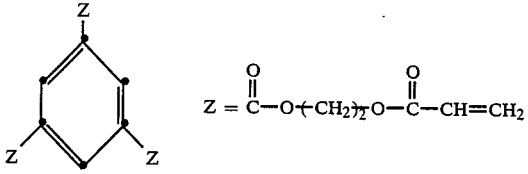 | 22.5 |
| (D) Photoinitiator Composition | |
|     Ethyl-p-dimethylaminobenzoate | 1.50 |
|     3-(4-cyanobenzoyl)-5,7-dipropoxycoumarin | 0.19 |
| (E) Photoinhibitor | |
|     Thiobis-4,4'-(2-tert-butyl-6-methylphenol) | 0.23 |

TABLE II
Composition of (Positive-Working) First Resist

| | Wt. % |
|---|---|
| Cresol-formaldehyde resin esterified with 6-diazo-5,6-dihydro-5-oxo-1-naphthalene sulfonyl chloride | 69.3 |
| Poly(ethylacrylate-co-methacrylic acid) (90:10 mole ratio) | 29.7 |
| Acetic acid | 1.0 |

The sample was processed as follows:

(1) The sample strip was exposed with a Colight M-218 exposing unit (400 watt mercury lamp) using a Kodak T-14 (0.15) neutral density step tablet.

(2) Exposed positive resist was immersion developed for 90 seconds in aqueous-diluted KMPR-809 developer (1:1) to completely remove the exposed areas, and generate 3 sharp steps in the step tablet area. A final water rinse was used to remove all traces of developer.

(3) The unprotected copper foil (exposed areas) was chemically removed using a HCl-CuCl₂ spray etcher.

(4) The protective positive resist was then removed in a stripper of KMPR-809 developer and isopropanol.

(5) The exposed negative resist film was then spray developed with 1,1,1-trichloroethane to remove the unexposed areas and generate 8 sharp steps in the step tablet area. A final water rinse was used to remove all traces of developer.

(6) The strip was then baked in an oven for 5 minutes at 200° C. to remove solvent and increase polymerization of the monomers.

(7) The processed tape was thermal compression bonded to gold bumped IC chips using a Jade JEMS/-LAB bonder. The bonding cycle was for about 2 seconds at about 400° C.

Example 1 demonstrates the formation of a spacer layer that adhered well to the copper and demonstrated little tendency to crack or break when processed through step 7. Moreover, the spacer exhibited superior dimensional integrity and hardness at such processing temperatures.

Example 1 was repeated except that the weight ratio of component (B) to (C) was 3:1 and 1:3. Similar results were obtained.

COMPARATIVE EXAMPLES 1-A, 1-B and 1-C

Example 1 was repeated except that the composition of the negative-working resist was as described in Examples 1-3 of U.S. Pat. No. 4,247,623 noted above. Each of these comparative Examples exhibited poor dimensional integrity and softness during processing, thus negating the functional effectiveness of the negative-working resist of maintaining the beam leads in the desired orientation prior to, during and after bonding. This leads to IC packages of decreased reliability.

COMPARATIVE EXAMPLE 1-D

Example 1 was repeated except that monomer (C) above was used in place of the monomer mixture. The composition exhibited inferior photographic speed and was brittle, demonstrating a tendency to crack or break when processed through step (7) above.

EXAMPLES 4-8 OTHER POLYMERIC BINDERS

Example 1 was repeated except that the polymeric binder (component (A)) of the second resist was as noted in Table III.

TABLE III

| Example | Polymeric Binder |
|---------|------------------|
| 4 | Poly[4,4'-(4,7-methanohexahydroindan-5-ylidene)diphenylene terephthalate] |
| 5 | Poly[4,4'-isopropylidenediphenylene-co-4,4'-(4,7-methanohexahydroindan-5-ylidene)diphenylene (50:50) isothalate-co-terephthalate (50:50)] |
| 6 | Poly[4,4'-(4,7-methanohexahydroindan-5-ylidene)diphenylene 1,1,3-trimethyl-3-phenylindan-5,4'-dicarboxylate-co-terephthalate (30:70)] |
| 7 | Poly(4,4'-isopropylidenediphenylene 1,1,3-trimethyl-3-phenylindan-5,4'-dicarboxylate) |
| 8 | Poly[4,4'-(fluoren-9-ylidene)diphenylene 1,1,3-trimethyl-3-phenylindan-5,4'-dicarboxylate] |

Each of these negative resist formulations exhibited excellent flexibility and adhesion to the metal and superior performance during high temperature processing, serving effectively as a support for the beam leads.

This invention has been described in detail with particular reference to certain preferred embodiments thereof, but it will be understood that variations and modifications can be effected within the spirit and scope of the invention.

What is claimed is:

1. A laminate, adapted for manufacturing frames of metal beam leads that are bonded to integrated circuit chips, said laminate comprising
   (a) a flexible metal strip,
   (b) a layer of a first resist adhered to one surface of said metal strip, and
   (c) a layer of a second resist adhered to the opposite surface of said metal strip, wherein said second resist is a negative-working resist which comprises
   (1) a polymeric binder having a glass transition temperature of at least 150° C.,
   (2) a photopolymerizable monomer mixture comprising a monomer having the structural formula

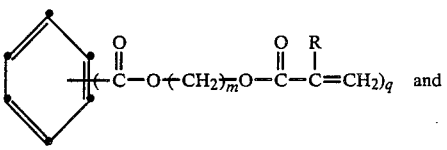

a monomer having the structural formula

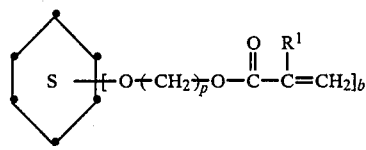

wherein q is 2, 3 or 4, b is 1 or 2, m and p are integers of from 1 to 10, and R and $R^1$ are individually H or $CH_3$, and
   (3) a photoinitiator composition.

2. The laminate of claim 1 wherein said photopolymerizable monomer mixture comprises

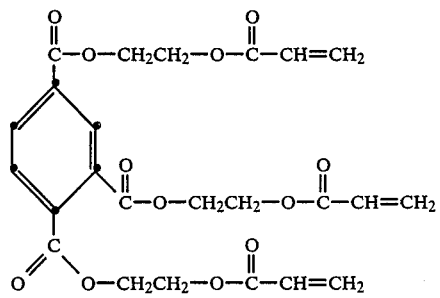

and

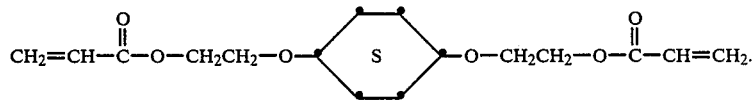

3. The laminate of claim 2 wherein each of said monomers is present in an amount of 5 to 40 weight percent based on the total weight of said negative-working support resist.

4. The laminate of claim 1 wherein said photoinitiator composition comprises a mixture of an amine and a 3-ketocoumarin.

5. The laminate of claim 1 wherein said binder is a polyester.

* * * * *